United States Patent
Kikuchi

(10) Patent No.: US 9,725,811 B2
(45) Date of Patent: Aug. 8, 2017

(54) COATED CUTTING TOOL

(71) Applicant: TUNGALOY CORPORATION, Iwaki-shi, Fukushima (JP)

(72) Inventor: Masakazu Kikuchi, Iwaki (JP)

(73) Assignee: Tungaloy Corporation, Iwaki-shi, Fukushima (JP)

(*) Notice: Subject to any disclaimer, the term of this patent is extended or adjusted under 35 U.S.C. 154(b) by 62 days.

(21) Appl. No.: 14/772,580

(22) PCT Filed: Mar. 4, 2014

(86) PCT No.: PCT/JP2014/055408
§ 371 (c)(1),
(2) Date: Sep. 3, 2015

(87) PCT Pub. No.: WO2014/136755
PCT Pub. Date: Sep. 12, 2014

(65) Prior Publication Data
US 2016/0017499 A1    Jan. 21, 2016

(30) Foreign Application Priority Data
Mar. 4, 2013 (JP) .................... 2013-041775

(51) Int. Cl.
*B23B 27/14* (2006.01)
*C23C 30/00* (2006.01)
(Continued)

(52) U.S. Cl.
CPC ............ *C23C 30/00* (2013.01); *B23B 27/148* (2013.01); *C01B 33/00* (2013.01);
(Continued)

(58) Field of Classification Search
USPC .......... 51/307, 309; 428/697, 698, 699, 701, 428/702, 704
See application file for complete search history.

(56) References Cited

U.S. PATENT DOCUMENTS

| | | |
|---|---|---|
| 2004/0110039 A1 | 6/2004 | Horling et al. |
| 2008/0075543 A1 | 3/2008 | Zhu et al. |
| 2010/0034603 A1 | 2/2010 | Waki et al. |

FOREIGN PATENT DOCUMENTS

| | | |
|---|---|---|
| JP | 3341328 B2 | 8/2002 |
| JP | 2002-331408 | 11/2002 |

(Continued)

OTHER PUBLICATIONS

Japanese Office Action dated Mar. 1, 2016, issued in JP counterpart application (No. 2015-504320).
(Continued)

*Primary Examiner* — Archene Turner
(74) *Attorney, Agent, or Firm* — Womble Carlyle

(57) ABSTRACT

A coated cutting tool has a substrate and a coating layer. At least one layer of the coating layer is a coarse grain layer with an average layer thickness of 0.2 to 10 μm and an average grain diameter in excess of 200 nm measured at the direction parallel to the interface of the coating layer. A composition of the layer is represented by $(Al_aTi_bM_c)X$, wherein M represents at least one of Zr, Hf, V, Nb, Ta, Cr, Mo, W, Y, B and Si, X represents at least one of C, N and O, and a, b and c represents atomic ratios of Al, Ti and M relative to one another such that $0.30 \leq a \leq 0.65$, $0.35 \leq b \leq 0.70$, $0 \leq c \leq 0.20$ and $a+b+c=1$.

16 Claims, 3 Drawing Sheets

(51) Int. Cl.
*C01B 33/00* (2006.01)
*C23C 14/06* (2006.01)

(52) U.S. Cl.
CPC ........ *C23C 14/0664* (2013.01); *C23C 30/005* (2013.01); *B23B 2228/105* (2013.01)

(56) References Cited

FOREIGN PATENT DOCUMENTS

| | | | |
|---|---|---|---|
| JP | 3526392 | B2 | 2/2004 |
| JP | 2006239792 | A | 9/2006 |
| JP | 2009050997 | A | 3/2009 |
| JP | 2009-178774 | | 8/2009 |
| JP | 2009-190091 | | 8/2009 |
| JP | 2011-156637 | | 8/2011 |
| JP | 2012061539 | A | 3/2012 |
| JP | 2012-166294 | * | 9/2012 |

OTHER PUBLICATIONS

DeLisle, Surface morphology and texture of TiAlN/CrN multilayer coatings, Thin Solid Films, 524 (2012) 100-106.
International Search Report in in PCT/JP2014/055408, filed Mar. 4, 2014.
Extended European Search Report issued in European counterpart application (No. 14761096.8).

* cited by examiner

COATED CUTTING TOOL

RELATED APPLICATIONS

This is a 371 U.S. National Phase of International Patent Application No. PCT/JP2014/055408 filed Mar. 4, 2014, and published as WO 2015/136755A1 on Sep. 12, 2014, which claims priority to JP 2013-041775, filed Mar. 4, 2013. The contents of the aforementioned applications are incorporated by reference in their entirety.

TECHNICAL FIELD

The present invention relates to a coated cutting tool.

BACKGROUND ART

A coated cutting tool in which a TiN layer or a TiAlN layer, etc., has been formed on the surface of a substrate such as a cemented carbide, a cermet, a cBN sintered body, etc., has widely been used for cutting processing of steel, cast iron, stainless steel, a heat resistant alloy, etc.

As the conventional technique of a coated cutting tool, there is a surface coated hard member which comprises a base material such as a WC-based cemented carbide, a cermet, ceramics, a high speed steel, etc., and a coating film formed on the surface thereof and comprising a nitride, an oxide, a carbide, a carbonitride or a boride of an alloy which comprises 2 or more kinds of elements selected from Group IVa, Va and VIa metallic elements and Al and Si which has been constituted with a grain diameter of 50 nm or less by the physical vapor deposition method (for example, see Patent Literature 1.).

Also, there is disclosed that, in a hard film-coated tool in which a single layer hard film comprising either one of a composite nitride, a composite carbide or a composite carbonitride which mainly comprises Ti and Al, or a multilayer hard film comprising two or more kinds of the above is formed on the surface of a substrate, the hard film-coated tool comprises an average value of a crystal grain diameter (b) to a transverse direction of the hard film crystal grain being set in the range of 0.1 to 0.4 μm, and an average value of an aspect ratio a/b of the crystal grain diameter of the hard film being set in the range of 1.5 to 7 (for example, see Patent Literature 2.).

PRIOR ART REFERENCES

Patent Literatures

Patent Literature 1: JP Patent No. 3,341,328C
Patent Literature 2: JP Patent No. 3,526,392C

SUMMARY OF THE INVENTION

Problems to be Solved by the Invention

In recent years, machine tools achieve high performance remarkably, and cutting processing has now been carried out under severe cutting conditions such as high-speed cutting, high feed machining, etc., accompanied thereby. When a conventional coated cutting tool is used under such cutting conditions, there is a problem that wear resistance is lowered. An object of the present invention is to provide a coated cutting tool excellent in wear resistance and having a longer tool life than the conventional ones.

Means to Solve the Problems

The present inventor has intensively studied on improvement in wear resistance of the coating layer, and obtained the finding that improvement in wear resistance and longer life of the coated cutting tool could be realized by optimizing the composition of the coating layer and making a grain diameter thereof coarse grain, whereby the present invention has been accomplished.

That is, summary of the present invention is as follows.

(1) A coated cutting tool comprising a substrate and a coating layer formed on a surface of the substrate, at least one layer of the coating layer being a coarse grain layer having an average grain diameter Lx measured at a direction parallel to an interface between the coating layer and the substrate exceeding 200 nm, and a composition of which being represented by $(Al_aTi_bM_c)X$ [wherein M represents at least one kind of an element(s) selected from the group consisting of Zr, Hf, V, Nb, Ta, Cr, Mo, W, Y, B and Si, X represents at least one kind of an element(s) selected from the group consisting of C, N and O, a represents an atomic ratio of an Al element based on a total of the Al element, a Ti element and an M element, b represents an atomic ratio of a Ti element based on a total of an Al element, the Ti element and an M element, c represents an atomic ratio of an M element based on a total of an Al element, a Ti element and the M element, and a, b and c each satisfy $0.30 \leq a \leq 0.65$, $0.35 \leq b \leq 0.70$, $0 \leq c \leq 0.20$, and $a+b+c=1$.], and an average layer thickness of the coarse grain layer being 0.2 to 10 μm.

(2) The coated cutting tool of (1), wherein a, b and c each satisfy $0.30 \leq a \leq 0.50$, $0.50 \leq b \leq 0.70$, $0 \leq c \leq 0.20$ and $a+b+c=1$.

(3) The coated cutting tool of (1) or (2), wherein X of the coarse grain layer represents N.

(4) The coated cutting tool of any one of (1) to (3), wherein an average grain diameter Lx of the coarse grain layer measured at a direction parallel to an interface between the coating layer and the substrate exceeds 400 nm and 1,000 nm or less.

(5) The coated cutting tool of any one of (1) to (4), wherein a grain diameter ratio (Ly/Lx) of an average grain diameter Ly of the coarse grain layer measured at a direction perpendicular to an interface between the coating layer and the substrate to an average grain diameter Lx of the coarse grain layer measured at a direction parallel to an interface between the coating layer and the substrate is 0.7 or more and less than 1.5.

(6) The coated cutting tool of any one of (1) to (5), wherein the coarse grain layer is cubic.

(7) The coated cutting tool of (6), wherein a full width at half maximum intensity (FWHM) of an X-ray diffraction peak of a (200) plane of the coarse grain layer is 0.6° or less.

(8) The coated cutting tool of any one of (1) to (7), wherein the coating layer comprises a lower layer formed on the surface of the substrate and a coarse grain layer formed on the surface of the lower layer, and the lower layer is a single layer or a multilayer comprising at least one kind of a material(s) selected from a metal comprising at least one kind of metallic elements selected from the group consisting of Ti, Zr, Hf, V, Nb, Ta, Cr, Mo, W, Y, Al and Si, and a compound comprising at least one kind of these metallic elements and at least one kind of nonmetallic elements selected from the group consisting of carbon, nitrogen, oxygen and boron.

(9) The coated cutting tool of any one of (1) to (8), wherein the coarse grain layer is an uppermost layer.

(10) A coated cutting tool which comprises a substrate and a coating layer formed on a surface of the substrate, at least one layer of the coating layer being a coarse grain layer having an average grain diameter Lx measured at a direction parallel to an interface between the coating layer and the substrate exceeding 200 nm, and a composition of which being represented by $(Al_dCr_eL_f)Z$ [wherein L represents at least one kind of an element(s) selected from the group consisting of Ti, Zr, Hf, V, Nb, Ta, Mo, W, Y, B and Si, Z represents at least one kind of an element(s) selected from the group consisting of C, N and O, d represents an atomic ratio of an Al element based on a total of the Al element, a Cr element and an L element, e represents an atomic ratio of a Cr element based on a total of an Al element, the Cr element and an L element, f represents an atomic ratio of an L element based on a total of an Al element, a Cr element and the L element, and d, e and f each satisfy $0.25 \le d \le 0.70$, $0.30 \le e \le 0.75$, $0 \le f \le 0.20$ and $d+e+f=1$.] and an average layer thickness of the coarse grain layer being 0.2 to 10 μm.

(11) The coated cutting tool of (10), wherein d, e and f each satisfy $0.40 \le d \le 0.70$, $0.30 \le e \le 0.50$, $0 \le f \le 0.20$, $d \le e$, and $d+e+f=1$.

(12) The coated cutting tool of (10) or (11), wherein Z of the coarse grain layer represents N.

(13) The coated cutting tool of any one of (10) to (12), wherein an average grain diameter Lx of the coarse grain layer measured at a direction parallel to an interface between the coating layer and the substrate exceeds 400 nm and 1,000 nm or less.

(14) The coated cutting tool of any one of (10) to (13), wherein a grain diameter ratio (Ly/Lx) of an average grain diameter Ly of the coarse grain layer measured at a direction perpendicular to an interface between the coating layer and the substrate to an average grain diameter Lx of the coarse grain layer measured at a direction parallel to an interface between the coating layer and the substrate is 0.7 or more and less than 1.5.

(15) The coated cutting tool of any one of (10) to (14), wherein the coarse grain layer is cubic.

(16) The coated cutting tool of (15), wherein a full width at half maximum intensity (FWHM) of an X-ray diffraction peak at a (200) plane of the coarse grain layer is 0.6° or less.

(17) The coated cutting tool of any one of (10) to (16), wherein the coating layer comprises a lower layer formed on a surface of the substrate and a coarse grain layer formed on a surface of the lower layer, and the lower layer is a single layer or a multilayer comprising at least one kind of a material(s) selected from
a metal comprising at least one kind of metallic elements selected from the group consisting of Ti, Zr, Hf, V, Nb, Ta, Cr, Mo, W, Y, Al and Si, and
a compound comprising at least one kind of these metallic elements and at least one kind of nonmetallic elements selected from the group consisting of carbon, nitrogen, oxygen and boron.

(18) The coated cutting tool of any one of (10) to (17), wherein the coarse grain layer is an uppermost layer.

The coated cutting tool of the present invention comprises a substrate and a coating layer formed on the surface of the substrate. The substrate of the present invention is not particularly limited so long as it is used as a substrate for a coated cutting tool, and may be mentioned, for example, a cemented carbide, a cermet, ceramics, a cubic boron nitride sintered body, a diamond sintered body, a high speed steel, etc. Among these, it is more preferred that the substrate is a cemented carbide since wear resistance and fracture resistance are excellent.

The coating layer of the present invention are not particularly limited so long as it is used as the coating layer for a coated cutting tool, and among these, it is more preferred that it is a single layer or a multilayer comprising at least one kind of a material selected from a metal comprising at least one kind of a metallic element selected from the group consisting of Ti, Zr, Hf, V, Nb, Ta, Cr, Mo, W, Y, Al and Si, and a compound comprising at least one kind of these metallic elements and at least one kind of a nonmetallic element selected from the group consisting of carbon, nitrogen, oxygen and boron since wear resistance is improved. A composition of the respective layers constituting the coating layer of the present invention can be measured by using an energy dispersive X-ray spectroscopy (EDS) or a wavelength-dispersive X-ray spectroscopy (WDS), etc., attached to an electron microscope such as a scanning electron microscope (SEM), a field-emission type scanning electron microscope (FE-SEM), a transmission electron microscope (TEM), etc.

An average layer thickness of the whole coating layer of the present invention is preferably 0.2 to 10 μm. This is because, if the average layer thickness of the whole coating layer of the present invention is less than 0.2 μm, an effect of improving wear resistance is a little, while if it exceeds 10 μm, the layer tends to be easily peeled off. The layer thickness of the whole coating layer and the layer thicknesses of the respective layers constituting the coating layer of the present invention are measured 5 portions or more at the position of 50 μm from the surface of an edge of a blade opposed to the metal evaporation source toward the center portion of the surface by using an optical microscope, SEM, FE-SEM, TEM, etc., and an average value thereof is made an average layer thickness of the whole coating layer and an average layer thickness of the respective layers constituting the coating layer.

One of the present invention is directed to a coarse grain layer wherein at least one layer of the coating layer has an average grain diameter measured at a direction parallel to an interface between the coating layer and the substrate exceeding 200 nm, and a composition of which is represented by $(Al_aTi_bM_c)X$ [wherein M represents at least one kind of an element(s) selected from the group consisting of Zr, Hf, V, Nb, Ta, Cr, Mo, W, Y, B and Si, X represents at least one kind of an element(s) selected from the group consisting of C, N and O, a represents an atomic ratio of an Al element based on a total of the Al element, a Ti element and an M element, b represents an atomic ratio of a Ti element based on a total of an Al element, the Ti element and an M element, c represents an atomic ratio of an M element based on a total of an Al element, a Ti element and the M element, a, b and c each satisfy $0.30 \le a \le 0.65$, $0.35 \le b \le 0.07$, $0 \le c \le 0.20$ and $a+b+c=1$.]. If a is less than 0.30, it becomes too coarse grain to lower fracture resistance, while if a is large exceeding 0.65, it becomes too fine grain to lower wear resistance, and if b is less than 0.35, it becomes too fine grain to lower wear resistance, while if b is too large exceeding 0.70, it becomes too coarse grain to lower fracture resistance. When at least one kind of elements selected from the group consisting of Zr, Hf, V, Nb, Ta, Cr, Mo, W, Y, B and Si may be contained in the coarse grain layer other than the Al element and the Ti element, if c is in the range of 0 or more and 0.20 or less, the structure of the coarse grain layer is densified, so that strength of the coarse grain layer is improved and wear resistance of the whole coating layer can be heightened. If c becomes large exceeding 0.20, it becomes too fine grain to lower wear resistance. Therefore, these values are set to $0.30 \le a \le 0.65$, $0.35 \le b \le 0.70$, $0 \le c \le 0.20$ and $a+b+c=1$. Among these, when $0.30 \leq a \leq 0.50$, $0.50 \leq b \leq 0.70$, $0 \leq c \leq 0.20$ and $a+b+c=1$ are satisfied, it is more preferred since the average grain diameter easily becomes large, and wear resistance tends to be improved. X represents at least one kind of an element(s) selected from the group consisting of C, N and O, among these, when X represents CN or N, it is preferred since wear resistance is improved, and among these, when X represents N, it is more preferred since wear resistance is improved.

One of the present invention is directed to a coarse grain layer wherein at least one layer of the coating layer has an average grain diameter Lx measured at a direction parallel to an interface between the coating layer and the substrate exceeding 200 nm, and a composition of which is represented by $(Al_dCr_eL_f)Z$ [wherein L represents at least one kind of an element(s) selected from the group consisting of Ti, Zr, Hf, V, Nb, Ta, Mo, W, Y, B and Si, Z represents at least one kind of an element(s) selected from the group consisting of C, N and O, d represents an atomic ratio of an Al element based on a total of the Al element, a Cr element and an L element, e represents an atomic ratio of a Cr element based on a total of an Al element, the Cr element and an L element, f represents an atomic ratio of an L element based on a total of an Al element, a Cr element and the L element, d, e and f each satisfy $0.25 \leq d \leq 0.70$, $0.30 \leq e \leq 0.75$, $0 \leq f \leq 0.20$, $d \leq e$, and $d+e+f=1$.]. If d is less than 0.25, it becomes too coarse grain to lower fracture resistance, while if d becomes large exceeding 0.70, it becomes too fine grain to lower wear resistance, and if e is less than 0.3, it becomes too fine grain to lower wear resistance, while if e becomes large exceeding 0.75, it becomes too coarse grain to lower fracture resistance. When at least one kind of an element selected from the group consisting of Ti, Zr, Hf, V, Nb, Ta, Mo, W, Y, B and Si may be contained in the coarse grain layer other than the Al element and the Cr element, if f is in the range of 0 or more and 0.20 or less, the structure of the coarse grain layer is densified, so that strength of the coarse grain layer is improved and wear resistance of the whole coating layer can be heightened. If f becomes large exceeding 0.20, it becomes too fine grain to lower wear resistance. Therefore, these values are set to $0.25 \leq d \leq 0.70$, $0.3 \leq e \leq 0.75$, $0 \leq f \leq 0.20$ and $d+e+f=1$. Among these, when $d \leq e$, and $0.40 \leq d \leq 0.70$, $0.3 \leq e \leq 0.50$, $0 \leq f \leq 0.20$ and $d+e+f=1$ are satisfied, it is more preferred since the average grain diameter easily becomes large, and wear resistance tends to be improved. Z represents at least one kind of an element(s) selected from the group consisting of C, N and O, among these, when Z represents CN or N, it is preferred since wear resistance is improved, and among these, when Z represents N, it is more preferred since wear resistance is improved.

As mentioned above, in the present invention, when the composition of at least one layer of the coating layer is represented by $(Al_aTi_bM_c)X$ or $(Al_dCr_eL_f)Z$, and the content of Ti or Cr is within the above-mentioned range, a coated cutting tool excellent in both of wear resistance and fracture resistance can be obtained. Incidentally, when the content of Ti is set within the range of $0.35 \leq b \leq 0.70$, the content of Cr is preferably suppressed to 0.20 or less, and when the content of Cr is set within the range of $0.3 \leq e \leq 0.75$, the content of Ti is preferably suppressed to 0.20 or less.

The coarse grain layer of the present invention has an average grain diameter Lx exceeds 200 nm when it is measured at a direction parallel to an interface between the coating layer and the substrate, so that it is excellent in wear resistance. The reason can be considered as follows. If the average grain diameter of the coating layer is small as shown in FIG. 1, drop of the crystal grains of the coating layer likely occur as shown in FIG. 2 by the external force generating at the time of cutting. On the other hand, the average grain diameter of the coating layer is large as shown in FIG. 3, drop of the crystal grains of the coating layer difficultly occur as shown in FIG. 4 by the external force generating at the time of cutting. In the coarse grain layer of the present invention, an average grain diameter Lx when it is measured at a direction parallel to an interface between the coating layer and the substrate exceeds 200 nm. As the average grain diameter Lx is larger, excellent wear resistance is shown, so that the average grain diameter Lx of 400 nm or more is more preferred. However, manufacture of the coarse grain layer having an average grain diameter Lx exceeding 1,000 nm is difficult, and in consideration with the productivity, the average grain diameter Lx is more preferably in the range of 400 to 1,000 nm. In addition, at the time of cutting, dropping of the crystal grain occurs from the surface of the coating layer, so that it is more preferred when the outermost surface side of the coating layer is the coarse grain layer, i.e., the uppermost layer is the coarse grain layer since an effect of improving wear resistance is heightened. The coarse grain layer of the present invention is excellent in wear resistance. Therefore, wear resistance of the coating layer is improved, and the tool life of the coated cutting tool of the present invention can be elongated.

In the present invention, the average grain diameter Lx of the coarse grain layer measured at a direction parallel to an interface between the coating layer and the substrate can be measured at the structure in which droplets having a diameter of 100 nm or more are removed from the surface structure obtained by mirror polishing an interface of the coarse grain layer at the surface side. More specifically, by removing the portion from the interface of the coarse grain layer at the surface side to the depth of 100 nm by polishing, etc., and the average grain diameter Lx of the coarse grain layer is measured at the surface structure which became a mirror surface. As the polishing method, there may be mentioned a method in which the surface is polished by using a diamond paste or colloidal silica to make a minor surface, or ion milling, etc. The surface structure of the coarse grain layer which became a minor surface is observed by an SEM, FE-SEM, TEM, an electron backscatter diffraction patterning device (EBSD), etc., and from the structure in which the droplets having a diameter of 100 nm or more are excluded, a diameter of a circle having an area equal to the area of a certain crystal grain of the coarse grain layer is made a grain diameter of the crystal grain. According to the same method, grain diameters of the crystal grains contained in the observed surface structure are obtained. Thereafter, a grain size distribution comprising the horizontal axis showing a grain diameter divided with an interval of 5 nm, and the vertical axis showing an area ratio of the whole crystal grains contained in a division of an interval of 5 nm is prepared. Next, a center value (for example, a center value of a division of 5 to 10 nm is 7.5 nm) of the division with the interval of 5 nm and the area ratio of the whole crystal grains contained in the division are multiplied. All the values obtained by multiplying the center value of the division with the interval of 5 nm and the area ratio of the whole crystal grains contained in the division are summed and the resulting value is made an average grain diameter Lx of the coarse grain layer. As the measurement device, an EBSD is preferred since the grain boundary of the crystal grain becomes clear, and settings of the EBSD is preferably so set that a boundary with a step size of 0.01 μm, a measurement range of 2 μm×2 μm and an orientation difference of 5° or more is regarded as a grain boundary. Incidentally, from the surface structure of the coarse grain layer which became a mirror surface, droplet having a diameter of 100 nm or more and the structure other than the droplet can be easily distinguished. When the surface structure of the minor surface is observed, the droplet is circular and at around the droplet, there is a cavity with a thickness of several nm to several tens nm. Also, the droplet sometimes drops from the coarse grain layer during the mirror polishing. In such a case, a circular hole is generated at the coarse grain layer. Therefore, the droplet having a diameter of 100 nm or more and the structure other than the droplet can be easily distinguished in the coarse grain layer.

In the present invention, the average grain diameter Ly of the coarse grain layer measured at a direction perpendicular to an interface between the coating layer and the substrate is observed at the structure in which droplets having a width of 100 nm or more are removed from the cross-sectional structure obtained by mirror polishing the cross section of the coarse grain layer. As the method for mirror polishing the cross section of the coarse grain layer, there may be mentioned a method in which after grinding with diamond grindstone, polishing is carried out by using a diamond paste or colloidal silica, or ion milling, etc. The cross-sectional structure of the coarse grain layer which became a mirror surface is observed by an SEM, FE-SEM, TEM, EBSD, etc., the average grain diameter Ly of the coarse grain layer measured at a direction perpendicular to an interface between the coating layer and the substrate can be measured. More specifically, to an image obtained by observing the cross-sectional structure of the coarse grain layer enlarging 5,000 to 50,000-fold by an SEM, FE-SEM, TEM, EBSD, etc., straight lines are drawn to a direction perpendicular to an interface between the coating layer and the substrate with an interval of 500 nm as shown in FIG. 5. When the straight line is crossed to the droplet having a width of 100 nm or more, a straight line is further drawn at the portion 500 nm apart therefrom. A length from the interface of the coarse grain layer at the substrate side or the interface of the coarse grain layer at the surface side to the point at which the straight line and the grain boundary are crossed, or a length from the point at which the straight line and the grain boundary are crossed to the next point at which the straight line and the grain boundary are crossed is made Ln (n=1, 2, 3, . . .). When the straight line and the grain boundary are not crossed, a length from the interface of the coarse grain layer at the substrate side to the interface of the coarse grain layer at the surface side is made Ln. The value in which these are averaged is made the average grain diameter Ly. At this time, a number of the straight lines to be used for the measurement is preferably ten lines or more. Incidentally, from the cross-sectional structure of the coarse grain layer which became a mirror surface, the droplet having a width of 100 nm or more and the structure other than the droplet can be easily distinguished. When the cross-sectional structure of the mirror surface is observed, the droplet is circular, ellipse or teardrop, and a cavity with a thickness of several nm to several tens nm is generated at the interface at the substrate side of the droplet. Also, the droplet sometimes drops from the coarse grain layer during the minor polishing. In such a case, a circular, ellipse or teardrop hole is generated at the coarse grain layer. Therefore, the droplet having a width of 100 nm or more and the structure other than the droplet can be easily distinguished in the coarse grain layer.

In the present invention, the grain diameter ratio (Ly/Lx) of the average grain diameter Ly of the coarse grain layer measured at a direction perpendicular to an interface between the coating layer and the substrate to the average grain diameter Lx of the coarse grain layer measured at a direction parallel to an interface between the coating layer and the substrate exceeds 1.5, crack generated at the surface of the tool due to a load applied to the edge of a blade tends to proceed during the cutting processing and fracture resistance tends to be lowered. On the other hand, the grain diameter ratio (Ly/Lx) of Ly to Lx is 0.7 or more and 1.5 or less, both of wear resistance and fracture resistance tend to become good. Therefore, the grain diameter ratio (Ly/Lx) of Ly to Lx is more preferably 0.7 or more and 1.5 or less.

An average layer thickness of the coarse grain layer of the present invention was made 0.2 to 10 µm. If it is less than 0.2 µm, an effect of the coarse grain layer which improves wear resistance becomes a little, while if it exceeds 10 µm, adhesiveness of the substrate and the coating layer is lowered so that peeling or chipping is likely caused. Among these, the average layer thickness of the coarse grain layer of the present invention is further preferably 0.5 to 10 µm.

If the coarse grain layer of the present invention is cubic, it is further preferred since hardness is high and it is excellent in wear resistance. Among these, when the full width at half maximum intensity (FWHM) of the X-ray diffraction peak at the (200) plane of the coarse grain layer according to the present invention obtained by X-ray diffraction measurement using a Cu-Kα line is 0.6° or less, it is more preferred since dropping of the crystal grains of the coarse grain layer of the present invention is suppressed. The full width at half maximum intensity (FWHM) of the X-ray diffraction peak at the (200) plane of the coarse grain layer can be measured by using a commercially available X-ray diffractometer. For example, the X-ray diffraction measurement may be carried out under the conditions that the target: Cu, tube voltage: 50 kV, tube current: 250 mA, Cu-Kα line, scanning axis: 2θ/θ, a solar slit on an incident side: 5°, a divergence longitudinal slit: 2/3°, a divergence longitudinal restriction slit: 5 mm, scattering slit: 2/3°, a solar slit on light receiving side: 5°, a light receiving slit: 0.30 mm, a light receiving monochromatic slit: 0.8 mm, monochromation of X-ray: a graphite light receiving monochromatic meter (bending mode), sampling width: 0.01°, scanning speed: 4°/min, and a measurement range of Bragg angle (2θ) of 30° to 70°. When the X-ray diffraction measurement of the coarse grain layer of the present invention is carried out by the measurement conditions, an X-ray diffraction peak at the (200) plane which is cubic of the coarse grain layer of the present invention can be observed. With regard to the thus obtained X-ray diffraction peak at the (200) plane of the coarse grain layer, the full width at half maximum intensity (FWHM) is to be measured. Measurement of the full width at half maximum intensity (FWHM) may be carried out by using an X-ray diffractometer-attached analysis software. When the analysis software is used, background processing and Kα2 peak removal are carried out by using cubic spline, and profile fitting is carried out by using Pearson-VII function, then, peak position is obtained by the peak top method, whereby the full width at half maximum intensity (FWHM) is led out.

In the coating layer formed on the substrate, a layer formed at the surface side of a predetermined layer (for example, the coarse grain layer) can be called as an upper layer, and a layer formed at the substrate side of the predetermined layer as a lower layer. The coating layer of the present invention comprises the lower layer formed at the surface of the substrate and the coarse grain layer formed at the surface of the lower layer, and it is more preferred that the lower layer is a single layer or a multilayer comprising at least one kind of materials selected from the group consisting of a metal comprising at least one kind of metallic elements selected from the group consisting of Ti, Zr, Hf, V, Nb, Ta, Cr, Mo, W, Y, Al and Si, and a compound comprising at least one kind of these metallic elements and at least one kind of nonmetallic elements selected from the group consisting of carbon, nitrogen, oxygen and boron. When the lower layer excellent in adhesiveness to the substrate and in fracture resistance and the coarse grain layer excellent in wear resistance are laminated, cutting property can be further improved. An upper layer may be formed on the surface of the coarse grain layer of the present invention, but the uppermost layer of the coating layer is preferably a coarse grain layer.

The coating layer of the present invention can be formed by various physical vapor deposition methods such as an arc ion plating method, an ion plating method, a sputtering method, an ion mixing method, etc. More specifically, it may be carried out that a substrate is charged in a reaction vessel of a physical vapor deposition device, after the surface of the substrate is subjected to an ion bombardment treatment, a metal evaporation source corresponding to the composition of the coating layer is evaporated, a reaction gas such as $N_2$, $CH_4$, etc., is filled in the reaction vessel, the reaction vessel is made a predetermined pressure and a predetermined bias voltage is applied to the substrate to form the coating layer of the present invention.

As a method for forming the coarse grain layer of the present invention, an arc ion plating method is employed, and it is more preferred to make a magnetic flux density at the center of the metal evaporation source low, and to make a temperature of the substrate at the time of forming low, since an effect of improving wear resistance can be heightened. More specifically, it is more preferred to form a coarse grain layer of the present invention by the method that a pressure in the reaction vessel was made a predetermined pressure of 0.5 to 5.0 Pa, a bias voltage of −10V to −150V is applied to the substrate, a magnetic flux density at the center of the metal evaporation source is made a predetermined magnetic flux density of 7 mT to 12 mT, and a temperature of the sample is made a predetermined temperature of 500 to 700° C. Incidentally, the magnetic flux density at the center of the metal evaporation source can be measured by a Gauss meter.

Effects of the Invention

The coated cutting tool of the present invention accomplishes the effects that it is excellent in wear resistance and has long tool life.

EXAMPLE 1

Figure 1:
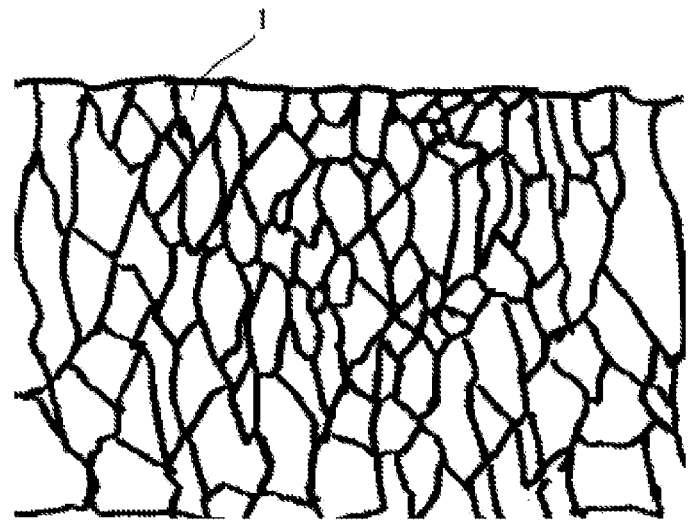
FIG. 1 is an example of a schematic drawing of a cross-sectional structure of a coating layer having a small average grain diameter before the cutting test.
Figure 2:
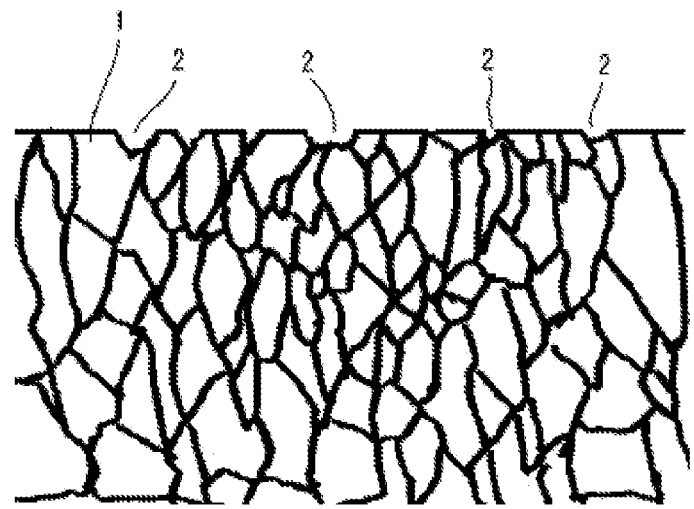
FIG. 2 is an example of a schematic drawing of a cross-sectional structure of a coating layer having a small average grain diameter after the cutting test.
Figure 3:
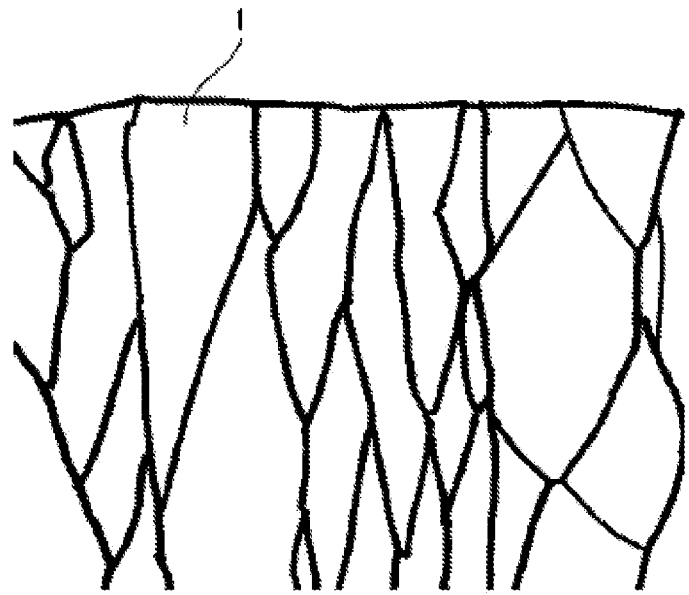
FIG. 3 is an example of a schematic drawing of a cross-sectional structure of a coating layer having a large average grain diameter before the cutting test.
Figure 4:
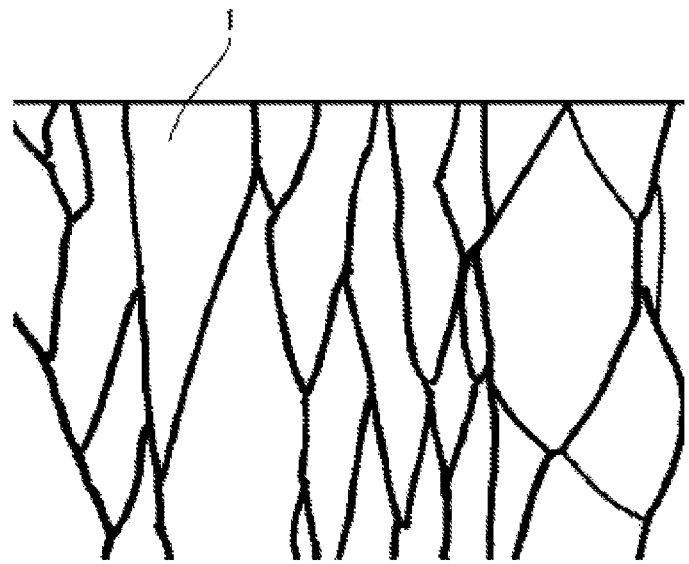
FIG. 4 is an example of a schematic drawing of a cross-sectional structure of a coating layer having a large average grain diameter after the cutting test.
Figure 5:
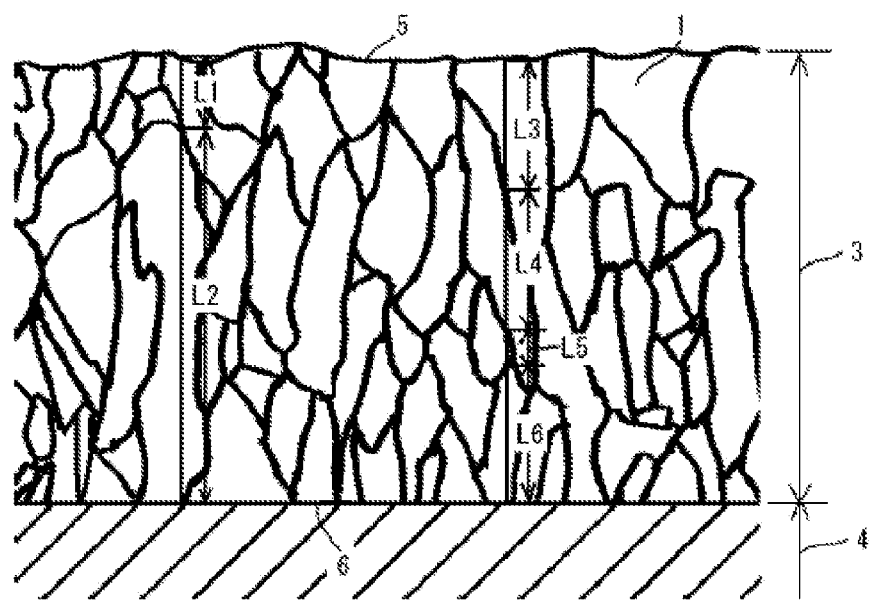
FIG. 5 is a schematic drawing of a cross-sectional structure of a coated cutting tool.

As a substrate, a cemented carbide corresponding to P20 having an insert shape of ISO standard SEKN1203AGTN was prepared. In a reaction vessel of an arc ion plating device, a metal evaporation source which became a starting material of a coating layer shown in Table 1 and Table 2 was set, and the substrate was attached to a sample holder in the reaction vessel of the arc ion plating device. A pressure in the reaction vessel was made vacuum of $1\times10^{31\ 2}$ Pa or less, and the substrate was heated to a temperature of 500° C. by a heater in the vessel. After the temperature of the substrate became 500° C., an Ar gas was introduced until a pressure in the reaction vessel became 5 Pa, and an atmosphere in the reaction vessel was made an Ar atmosphere. A pressure in the reaction vessel was made 5 Pa, and an Ar ion bombardment treatment was subjected to the substrate under ion bombardment conditions in which a bias voltage of −1000V was applied.

After the Ar ion bombardment treatment, the Ar gas was discharged and a pressure in the reaction vessel was made vacuum of $1\times10^{31\ 2}$ Pa or less. With regard to Sample Nos. 1 to 16 and 19 to 36, an $N_2$ gas was introduced into the reaction vessel to make a nitrogen atmosphere with a pressure of 3 Pa in the reaction vessel. With regard to Sample Nos. 17 and 18, a mixed gas in which an $N_2$ gas and a $CH_4$ gas were mixed so that a partial pressure ratio thereof became $N_2:CH_4=1:1$ was introduced into the reaction vessel to make a mixed gas atmosphere with a pressure of 3 Pa in the reaction vessel. Next, the substrate was heated until a temperature of the substrate became those shown in Table 1 and Table 2 by a heater in the vessel. A bias voltage applied to the substrate was made −50V, a magnetic flux density at the center of the metal evaporation source was made the magnetic flux density shown in Table 1 and Table 2, and a coating layer shown in Table 1 and Table 2 was each formed on the surface of the substrate under the coating conditions in which an arc current was made 150A. After forming the coating layer, the sample was cooled, and the temperature of the sample became 100° C. or lower, then, the sample was taken out from the reaction vessel.

TABLE 1

| | | Coating conditions | | | Coating layer | | | |
| | | | | | Average grain diameter Lx at direction parallel to interface of substrate (nm) | Average grain diameter Ly at direction perpendicular to interface of substrate (nm) | Grain diameter ratio (Ly/Lx) of Ly to Lx | Average layer thickness (μm) |
| Sample No. | | Magnetic flux density (mT) | Substrate temperature (° C.) | Composition | | | | |
|---|---|---|---|---|---|---|---|---|
| Present product | 1 | 10 | 500 | $(Al_{0.30}Ti_{0.70})N$ | 620 | 180 | 0.29 | 0.2 |
| | 2 | 10 | 500 | $(Al_{0.30}Ti_{0.70})N$ | 620 | 456 | 0.74 | 0.5 |
| | 3 | 10 | 500 | $(Al_{0.30}Ti_{0.70})N$ | 620 | 614 | 0.99 | 3.0 |

TABLE 1-continued

| | Coating conditions | | | Coating layer | | | |
|---|---|---|---|---|---|---|---|
| Sample No. | Magnetic flux density (mT) | Substrate temperature (° C.) | Composition | Average grain diameter Lx at direction parallel to interface of substrate (nm) | Average grain diameter Ly at direction perpendicular to interface of substrate (nm) | Grain diameter ratio (Ly/Lx) of Ly to Lx | Average layer thickness (μm) |
| 4 | 10 | 500 | $(Al_{0.30}Ti_{0.70})N$ | 620 | 883 | 1.42 | 10.0 |
| 5 | 10 | 500 | $(Al_{0.50}Ti_{0.50})N$ | 570 | 562 | 0.99 | 3.0 |
| 6 | 10 | 500 | $(Al_{0.25}Cr_{0.75})N$ | 590 | 168 | 0.28 | 0.2 |
| 7 | 10 | 500 | $(Al_{0.25}Cr_{0.75})N$ | 590 | 420 | 0.71 | 0.5 |
| 8 | 10 | 500 | $(Al_{0.25}Cr_{0.75})N$ | 590 | 576 | 0.98 | 3.0 |
| 9 | 10 | 500 | $(Al_{0.25}Cr_{0.75})N$ | 590 | 828 | 1.40 | 10.0 |
| 10 | 10 | 500 | $(Al_{0.50}Cr_{0.50})N$ | 450 | 468 | 1.04 | 3.0 |
| 11 | 10 | 500 | $(Al_{0.50}Ti_{0.45}W_{0.05})N$ | 510 | 492 | 0.96 | 3.0 |
| 12 | 10 | 500 | $(Al_{0.50}Cr_{0.45}W_{0.05})N$ | 480 | 398 | 0.83 | 3.0 |
| 13 | 10 | 500 | $(Al_{0.50}Ti_{0.45}Y_{0.05})N$ | 430 | 396 | 0.92 | 3.0 |
| 14 | 10 | 500 | $(Al_{0.50}Cr_{0.45}Y_{0.05})N$ | 410 | 324 | 0.79 | 3.0 |
| 15 | 10 | 500 | $(Al_{0.50}Ti_{0.45}Si_{0.05})N$ | 430 | 408 | 0.95 | 3.0 |
| 16 | 10 | 500 | $(Al_{0.50}Cr_{0.45}Si_{0.05})N$ | 410 | 336 | 0.82 | 3.0 |
| 17 | 10 | 500 | $(Al_{0.30}Ti_{0.70})CN$ | 550 | 564 | 1.03 | 3.0 |
| 18 | 10 | 500 | $(Al_{0.25}Cr_{0.75})CN$ | 550 | 540 | 0.98 | 3.0 |
| 19 | 10 | 700 | $(Al_{0.50}Ti_{0.50})N$ | 480 | 456 | 0.95 | 3.0 |
| 20 | 10 | 700 | $(Al_{0.50}Cr_{0.50})N$ | 370 | 420 | 1.14 | 3.0 |
| 21 | 10 | 700 | $(Al_{0.50}Ti_{0.45}W_{0.05})N$ | 390 | 396 | 1.02 | 3.0 |
| 22 | 10 | 700 | $(Al_{0.50}Cr_{0.45}W_{0.05})N$ | 370 | 360 | 0.97 | 3.0 |
| 23 | 10 | 700 | $(Al_{0.50}Ti_{0.45}Y_{0.05})N$ | 240 | 276 | 1.15 | 3.0 |
| 24 | 10 | 700 | $(Al_{0.50}Cr_{0.45}Y_{0.05})N$ | 220 | 240 | 1.09 | 3.0 |
| 25 | 10 | 700 | $(Al_{0.50}Ti_{0.45}Si_{0.05})N$ | 240 | 288 | 1.20 | 3.0 |
| 26 | 10 | 700 | $(Al_{0.50}Cr_{0.45}Si_{0.05})N$ | 220 | 252 | 1.15 | 3.0 |

TABLE 2

| | | Coating conditions | | | Coating layer | | | |
|---|---|---|---|---|---|---|---|---|
| | Sample No. | Magnetic flux density (mT) | Substrate temperature (° C.) | Composition | Average grain diameter Lx at direction parallel to interface of substrate (nm) | Average grain diameter Ly at direction perpendicular to interface of substrate (nm) | Grain diameter ratio (Ly/Lx) of Ly to Lx | Average layer thickness (μm) |
| Comparative product | 27 | 10 | 500 | $(Al_{0.70}Ti_{0.30})N$ | 70 | 48 | 0.69 | 3.0 |
| | 28 | 10 | 500 | $(Al_{0.75}Cr_{0.25})N$ | 180 | 122 | 0.68 | 3.0 |
| | 29 | 20 | 800 | $(Al_{0.50}Ti_{0.50})N$ | 130 | 64 | 0.49 | 3.0 |
| | 30 | 20 | 700 | $(Al_{0.50}Cr_{0.50})N$ | 150 | 96 | 0.64 | 3.0 |
| | 31 | 20 | 700 | $(Al_{0.50}Ti_{0.45}W_{0.05})N$ | 120 | 80 | 0.67 | 3.0 |
| | 32 | 20 | 700 | $(Al_{0.50}Cr_{0.45}W_{0.05})N$ | 110 | 68 | 0.62 | 3.0 |
| | 33 | 20 | 700 | $(Al_{0.50}Ti_{0.45}Y_{0.05})N$ | 80 | 44 | 0.55 | 3.0 |
| | 34 | 20 | 700 | $(Al_{0.50}Cr_{0.45}Y_{0.05})N$ | 60 | 28 | 0.47 | 3.0 |
| | 35 | 20 | 700 | $(Al_{0.50}Ti_{0.45}Si_{0.05})N$ | 80 | 48 | 0.60 | 3.0 |
| | 36 | 20 | 700 | $(Al_{0.50}Cr_{0.45}Si_{0.05})N$ | 60 | 32 | 0.53 | 3.0 |

With regard to the obtained samples, the layer thicknesses of the coating layer were measured at the 5 portions by using an optical microscope and FE-SEM at the position of 50 μm toward the center portion of the surface from the edge of a blade of a surface opposed to the metal evaporation source, and the averaged value thereof was made an average layer thickness of the coating layer. The composition of the coating layer was measured by using an FE-SEM-attached EDS and an FE-SEM-attached WDS.

With regard to the obtained samples, from the surface to the depth of 100 nm of the coating layer was grinded by a diamond paste, and further polished to a minor surface by using colloidal silica. The surface structure of the coating layer which became a mirror surface was observed by an EBSD, and an average grain diameter Lx of the coating layer was measured. The EBSD was so set that a boundary having a step size of 0.01 μm, a measurement range of 2 μm×2 μm, and an orientation difference of 5° or more was regarded as a grain boundary. A diameter of a circle having an area equal to the area of a certain crystal grain of the coarse grain layer was made a grain diameter of the crystal grain. According to the same method, grain diameters of the crystal grains contained in the observed surface structure were obtained. Thereafter, a grain size distribution comprising the horizontal axis showing a grain diameter divided with an interval of 5 nm, and the vertical axis showing an area ratio of the whole crystal grains contained in a division of an interval of 5 nm was prepared, and a center value of the division with the interval of 5 nm and the area ratio of the whole crystal grains contained in the division were multiplied. The value in which all the values obtained by multiplying the center value of the division with the interval of 5 nm and the area ratio of the whole crystal grains contained in the division had been summed was made an average grain diameter Lx of the coarse grain layer.

A cross section of the sample obtained by cutting with a cutter was grinded by a diamond paste, and further polished to a minor surface by using colloidal silica. The cross section of the coating layer which became a minor surface was observed by an EBSD, and the average grain diameter Ly of the coating layer measured at a direction perpendicular to an interface between the coating layer and the substrate was measured. At this time, the EBSD was so set that a boundary with a step size of 0.01 μm, a measurement range of 2 μm×2 μm and an orientation difference of 5° or more is regarded as grain boundary. To an image of the cross-sectional structure of the coating layer enlarged to 5,000 to 50,000-fold by the EBSD were drawn ten straight lines to a direction perpendicular to an interface between the coating layer and the substrate with an interval of 500 nm. A length from the interface of the coating layer at the substrate side or an interface of the coating layer at the surface side to the point at which the straight line and the grain boundary were crossed, or a length from the point at which the straight line and the grain boundary are crossed to the next point at which the straight line and the grain boundary were crossed was made Ln (n=1, 2, 3, . . .). Also, when the straight line and the grain boundary were not crossed, a length from the interface of the coating layer at the substrate side to the interface of the coarse grain layer at the surface side was made Ln. An average value of these Ln's was made an average grain diameter Ly.

With regard to the obtained samples, the X-ray diffraction measurement was carried out under the conditions that the target: Cu, tube voltage: 50 kV, tube current: 250 mA, Cu-Kα line, scanning axis: 2θ/θ, a solar slit on an incident side: 5°, a divergence longitudinal slit: 2/3°, a divergence longitudinal restriction slit: 5 mm, scattering slit: 2/3°, a solar slit on light receiving side: 5°, a light receiving slit: 0.30 mm, a light receiving monochromatic slit: 0.8 mm, monochromation of X-ray: a graphite light receiving monochromatic meter (bending mode), sampling width: 0.01°, scanning speed: 4°/min, and a measurement range of Bragg angle (2θ) of 30° to 70°. As a result, it could be found that all the crystal system of the obtained coating layer were cubic. A composition of the coating layer, an average grain diameter Lx at a direction parallel to an interface between the coating layer and the substrate, an average grain diameter Ly at a direction perpendicular to an interface between the coating layer and the substrate, a grain diameter ratio (Ly/Lx) of the average grain diameter Ly to the average grain diameter Lx, and an average layer thickness of the whole coating layer are shown in Table 1 and Table 2.

The obtained sample was attached to the following mentioned milling cutter and Machining test 1 was carried out. Processing distances until the samples reach to the tool life were shown in Table 3 and Table 4.

[Machining Test 1]
Work piece material: S45C.,
Cutting speed: 200 m/min,
Feed: 0.2 mm/tooth,
Depth of cut: 2.0 mm,
Width of cut: 50 mm,
Cutter effective diameter: φ100 mm,
Coolant: Not used (dry processing),
Judgement of tool life: When a maximum flank wear width reached to 0.2 mm, then the time was the end of tool life.

TABLE 3

| Sample No. | | Processing distance until sample reaches to tool life (m) |
|---|---|---|
| Present product | 1 | 3.6 |
| | 2 | 9.1 |
| | 3 | 12.3 |
| | 4 | 14.1 |
| | 5 | 11.2 |
| | 6 | 3.4 |
| | 7 | 8.4 |
| | 8 | 11.5 |
| | 9 | 13.2 |
| | 10 | 9.4 |
| | 11 | 9.8 |
| | 12 | 8.0 |
| | 13 | 7.9 |
| | 14 | 6.5 |
| | 15 | 8.2 |
| | 16 | 6.7 |
| | 17 | 11.3 |
| | 18 | 10.8 |
| | 19 | 9.1 |
| | 20 | 8.4 |
| | 21 | 7.9 |
| | 22 | 7.2 |
| | 23 | 5.5 |
| | 24 | 4.8 |
| | 25 | 5.8 |
| | 26 | 5.0 |

TABLE 4

| Sample No. | | Processing distance until sample reaches to tool life (m) |
|---|---|---|
| Comparative product | 27 | 1.0 |
| | 28 | 2.4 |
| | 29 | 1.3 |
| | 30 | 1.9 |
| | 31 | 1.6 |
| | 32 | 1.4 |
| | 33 | 0.9 |
| | 34 | 0.6 |
| | 35 | 1.0 |
| | 36 | 0.6 |

As shown in Table 3 and Table 4, Present products having large average grain diameters Lx at a direction parallel to an interface between the coating layer and the substrate are excellent in wear resistance so that the processing distances until the samples reach to the tool life were longer than those of Comparative products.

EXAMPLE 2

As a substrate, a cemented carbide corresponding to P20 having an insert shape of ISO standard SEKN1203AGTN was prepared. In a reaction vessel of an arc ion plating device, a metal evaporation source which became a starting material of coating layer shown in Table 5 was set, the substrate was attached to a sample holder in the reaction vessel of the arc ion plating device and an Ar ion bombardment treatment was carried out under the same conditions as in Example 1. After the Ar ion bombardment treatment, the Ar gas was discharged and a pressure in the reaction vessel was made vacuum of $1\times10^{-2}$ Pa or less. An $N_2$ gas was introduced into the reaction vessel to make a pressure in the reaction vessel a nitrogen atmosphere at 3 Pa. After the substrate was heated to a temperature as shown in Table 5 by a heater in the vessel, a bias voltage to be applied to the substrate was made −50V, a magnetic flux density at the center of the metal evaporation source was made a magnetic flux density as shown in Table 5, and the coating layer shown in Table 5 was formed on the surface of the substrate under the coating conditions that an arc current was made 150A. After forming the coating layer, the sample was cooled, and after the temperature of the sample became 100° C. or lower, the sample was taken out from the reaction vessel.

[Machining Test 2]
Work piece material: S45C.,
Cutting speed: 250 m/min,
Feed: 0.1 mm/tooth,
Depth of cut: 2.0 mm,
Width of cut: 50 mm,
Cutter effective diameter: ϕ100 mm,
Coolant: Not used (dry processing),
Judgement of tool life: When a maximum flank wear width reached to 0.2 mm, then the time was the end of tool life.

[Machining Test 3]
Work piece material: SCM440,
Cutting speed: 250 m/min,
Feed: 0.4 mm/tooth,
Depth of cut: 2.0 mm,
Width of cut: 105 mm,
Cutter effective diameter: ϕ125 mm,
Coolant: Not used (dry processing),
Judgement of tool life: When the sample fractured, then the time was the end of tool life.

TABLE 5

| | Coating conditions | | | Coating layer | | | |
|---|---|---|---|---|---|---|---|
| Sample No. | Magnetic flux density (mT) | Substrate temperature (° C.) | Composition | Average grain diameter Lx at direction parallel to interface of substrate (nm) | Average grain diameter Ly at direction perpendicular to interface of substrate (nm) | Grain diameter ratio (Ly/Lx) of Ly to Lx | Average layer thickness (μm) |
| Present product 37 | 10 | 500 | $(Al_{0.30}Ti_{0.70})N$ | 620 | 456 | 0.74 | 0.5 |
| 38 | 10 | 500 | $(Al_{0.30}Ti_{0.70})N$ | 620 | 614 | 0.99 | 3.0 |
| 39 | 10 | 500 | $(Al_{0.30}Ti_{0.70})N$ | 620 | 883 | 1.42 | 10.0 |
| 40 | 10 | 500 | $(Al_{0.25}Cr_{0.75})N$ | 590 | 420 | 0.71 | 0.5 |
| 41 | 10 | 500 | $(Al_{0.25}Cr_{0.75})N$ | 590 | 576 | 0.98 | 3.0 |
| 42 | 10 | 500 | $(Al_{0.25}Cr_{0.75})N$ | 590 | 828 | 1.40 | 10.0 |
| Comparative product 43 | 10 | 500 | $(Al_{0.30}Ti_{0.70})N$ | 620 | 993 | 1.60 | 12.0 |
| 44 | 10 | 500 | $(Al_{0.25}Cr_{0.75})N$ | 590 | 934 | 1.58 | 12.0 |
| 45 | 20 | 850 | $(Al_{0.30}Ti_{0.70})N$ | 180 | 294 | 1.63 | 3.0 |
| 46 | 20 | 850 | $(Al_{0.25}Cr_{0.75})N$ | 160 | 258 | 1.61 | 3.0 |

With regard to the obtained samples, the crystal system, the composition, the average grain diameter Lx at a direction parallel to an interface between the coating layer and the substrate, the average grain diameter Ly at a direction perpendicular to an interface between the coating layer and the substrate, the grain diameter ratio (Ly/Lx) of the average grain diameter Ly to the average grain diameter Lx of the coating layer, and the average layer thickness of the whole coating layer were measured under the same measurement conditions as in Example 1. These results are shown in Table 5. Incidentally, all the coating layers of the obtained samples were cubic.

The obtained sample was attached to the following mentioned milling cutter and Machining tests 2 and 3 were carried out. Processing distances until the samples reach to the tool life were shown in Table 6. Incidentally, Machining test 2 is a test mainly evaluating wear resistance and Machining test 3 is a test mainly evaluating fracture resistance.

TABLE 6

| Sample No. | | Machining test 2 Processing distance until sample reaches to tool life (m) | Machining test 3 Processing distance until sample reaches to tool life (m) |
|---|---|---|---|
| Present product | 37 | 9.1 | 6.9 |
| | 38 | 12.3 | 6.4 |
| | 39 | 14.1 | 5.3 |
| | 40 | 8.4 | 6.7 |
| | 41 | 11.5 | 6.1 |
| | 42 | 13.2 | 5.1 |
| Comparative product | 43 | 7.9 | 3.2 |
| | 44 | 7.5 | 3.0 |
| | 45 | 2.4 | 2.8 |
| | 46 | 2.1 | 2.6 |

As shown in Table 6, Present products having large average grain diameters Lx at a direction parallel to an interface between the coating layer and the substrate are excellent in wear resistance and fracture resistance, so that the processing distances until the samples reach to the tool life were longer than those of Comparative products.

EXAMPLE 3

As a substrate, a cemented carbide corresponding to P20 having an insert shape of ISO standard SEKN1203AGTN was prepared. In a reaction vessel of an arc ion plating device, a metal evaporation source which became a starting material of coating layer shown in Table 7 was set, the substrate was attached to a sample holder in the reaction vessel of the arc ion plating device and an Ar ion bombardment treatment was carried out under the same conditions as in Example 1. After the Ar ion bombardment treatment, the Ar gas was discharged and a pressure in the reaction vessel was made vacuum of $1 \times 10^{-2}$ Pa or less. An $N_2$ gas was introduced into the reaction vessel to make a pressure in the reaction vessel a nitrogen atmosphere at 3 Pa. After the substrate was heated to a temperature as shown in Table 7 by a heater in the vessel, a bias voltage to be applied to the substrate was made −50V, a magnetic flux density at the center of the metal evaporation source was made a magnetic flux density as shown in Table 7, and the coating layer shown in Table 7 was formed on the surface of the substrate under the coating conditions that an arc current was made 150A. After forming the coating layer, the sample was cooled, and after the temperature of the sample became 100° C. or lower, the sample was taken out from the reaction vessel.

The obtained sample was attached to the following mentioned milling cutter and Machining test 4 was carried out. Processing distances until the samples reach to the tool life were shown in Table 8.

[Machining Test 4]
Work piece material: SCM440,
Cutting speed: 200 m/min,
Feed: 0.1 mm/tooth,
Depth of cut: 2.0 mm,
Width of cut: 50 mm,
Cutter effective diameter: φ100 mm,
Coolant: Not used (dry processing),
Judgement of tool life: When a maximum flank wear width reached to 0.2 mm, then the time was the end of tool life.

TABLE 8

| Sample No. | | Machining test 4 Processing distance until sample reaches to tool life (m) |
|---|---|---|
| Present product | 47 | 9.4 |
| | 48 | 8.4 |
| Comparative | 49 | 3.4 |
| product | 50 | 2.4 |

As shown in Table 8, Present products having large average grain diameters Lx at a direction parallel to an interface between the coating layer and the substrate and

TABLE 7

| | | Coating layer | | | | | | |
|---|---|---|---|---|---|---|---|---|
| | Coating conditions | | | Average grain diameter Lx at direction parallel to interface of substrate (nm) | Average grain diameter Ly at direction perpendicular to interface of substrate (nm) | Grain diameter ratio (Ly/Lx) of Ly to Lx | Full width at half maximum intensity (° C.) | Average layer thickness (µm) |
| Sample No. | Magnetic flux density (mT) | Substrate temperature (° C.) | Composition | | | | | |
| Present product | 47 | 10 | 550 | $(Al_{0.30}Ti_{0.70})N$ | 600 | 588 | 0.98 | 0.30 | 3.0 |
| | 48 | 10 | 550 | $(Al_{0.50}Ti_{0.50})N$ | 550 | 528 | 0.96 | 0.58 | 3.0 |
| Comparative product | 49 | 20 | 850 | $(Al_{0.50}Ti_{0.50})N$ | 110 | 56 | 0.51 | 0.68 | 3.0 |
| | 50 | 10 | 550 | $(Al_{0.70}Ti_{0.30})N$ | 60 | 40 | 0.67 | 0.80 | 3.0 |

With regard to the obtained samples, the crystal system, the composition, the average grain diameter Lx at a direction parallel to an interface between the coating layer and the substrate, the average grain diameter Ly at a direction perpendicular to an interface between the coating layer and the substrate, the grain diameter ratio (Ly/Lx) of the average grain diameter Ly to the average grain diameter Lx of the coating layer, and the average layer thickness of the coating layer was measured under the same measurement conditions as in Example 1. Incidentally, all the coating layers of the obtained samples were cubic. Further, with regard to the X-ray diffraction peak at the (200) plane of the coarse grain layer, using XRD analysis software JADE ver.6 manufactured by MDI (Materials Data Inc.), background processing and Kα2 peak removal were carried out by using cubic spline, and profile fitting was carried out by using Pearson-VII function, then, peak position was obtained by the peak top method, whereby the full width at half maximum intensity (FWHM) was led out. These results are shown in Table 7.

small full widths at half maximum intensity (FWHM) of the X-ray diffraction peak at the (200) plane of the coating layer are excellent in wear resistance so that the processing distances until the samples reach to the tool life were longer than those of Comparative products.

EXAMPLE 4

As a substrate, a cemented carbide corresponding to P20 having an insert shape of ISO standard SEKN1203AGTN was prepared. In a reaction vessel of an arc ion plating device, a metal evaporation source which became a starting material of coating layer shown in Table 9 was set, the substrate was attached to a sample holder in the reaction vessel of the arc ion plating device and an Ar ion bombardment treatment was carried out under the same conditions as in Example 1. After the Ar ion bombardment treatment, the Ar gas was discharged and a pressure in the reaction vessel was made vacuum of $1 \times 10^{31\ 2}$ Pa or less. An $N_2$ gas was introduced into the reaction vessel to make a pressure in the reaction vessel a nitrogen atmosphere at 3 Pa. After the substrate was heated until a temperature became 700° C. by a heater in the vessel, Layer A and Layer B shown in Table 9 were alternately formed under the coating conditions of a bias voltage to be applied to the substrate of −50V, a magnetic flux density at the center of the metal evaporation source of 20 mT and an arc current of 150A, to form the lower layers with an alternately laminated structure on the surface of the substrate.

Subsequently, the sample was heated by a heater in the vessel until a temperature became the temperature of an uppermost layer shown in Table 9, and the uppermost layer shown in Table 10 was formed on the surface of the lower layer under the coating conditions of a bias voltage to be applied to the substrate of −50V, a magnetic flux density at the center of the metal evaporation source of the magnetic flux density of the uppermost layer of Table 9 and an arc current of 150A. After forming the uppermost layer, the sample was cooled, and after the temperature of the sample became 100° C. or lower, the sample was taken out from the reaction vessel.

repeating times of the laminating period, the composition and the average layer thickness of the uppermost layer, and the average layer thickness of the whole coating layer were measured at the position of 50 μm from the surface of an edge of a blade opposed to the metal evaporation source toward the center portion of the surface by using an optical microscope, an FE-SEM and a TEM. Incidentally, with regard to the respective layer thicknesses of Layer A of the lower layer, Layer B of the lower layer, the uppermost layer and the whole coating layer, each measured at 5 portions, and these were averaged to make an average layer thickness of the respective layers. Also, the respective compositions of Layer A of the lower layer, Layer B of the lower layer and the uppermost layer were measured by using an FE-SEM-attached EDS, an FE-SEM-attached WDS, a TEM-attached EDS and a TEM-attached WDS. These results are shown in Table 9. With regard to the obtained samples, an X-ray diffraction measurement was carried out under the same measurement conditions as in Example 1, whereby the crystal system of the uppermost layer was measured. Incidentally, the uppermost layers of the obtained samples were all cubic. In addition, the average grain diameter Lx of the

TABLE 9

Coating layer
Lower layer (alternately laminated structure)

| | Sample No. | Layer A Composition | Layer A Average layer thickness (nm) | Layer B Composition | Layer B Average layer thickness (nm) | A + B laminating period (nm) | Repeated times of laminating period (times) | Average layer thickness of whole lower layer (μm) |
|---|---|---|---|---|---|---|---|---|
| Present product | 51 | $(Al_{0.70}Ti_{0.30})N$ | 100 | $(Al_{0.50}Ti_{0.50})N$ | 100 | 200 | 10 | 2.0 |
| | 52 | $(Al_{0.70}Ti_{0.30})N$ | 100 | $(Al_{0.50}Cr_{0.50})N$ | 100 | 200 | 10 | 2.0 |
| | 53 | $(Al_{0.70}Ti_{0.30})N$ | 100 | $(Al_{0.50}Ti_{0.50})N$ | 100 | 200 | 10 | 2.0 |
| | 54 | $(Al_{0.70}Ti_{0.30})N$ | 100 | $(Al_{0.50}Cr_{0.50})N$ | 100 | 200 | 10 | 2.0 |
| Comparative product | 55 | $(Al_{0.70}Ti_{0.30})N$ | 100 | $(Al_{0.50}Ti_{0.50})N$ | 100 | 200 | 10 | 2.0 |
| | 56 | $(Al_{0.70}Ti_{0.30})N$ | 100 | $(Al_{0.50}Cr_{0.50})N$ | 100 | 200 | 10 | 2.0 |
| | 57 | $(Al_{0.70}Ti_{0.30})N$ | 100 | $(Al_{0.50}Ti_{0.50})N$ | 100 | 200 | 10 | 2.0 |
| | 58 | $(Al_{0.70}Ti_{0.30})N$ | 100 | $(Al_{0.50}Cr_{0.50})N$ | 100 | 200 | 10 | 2.0 |

Coating layer
Uppermost layer

| | Sample No. | Coating conditions Magnetic flux density (mT) | Coating conditions Sample temperature (° C.) | Composition | Average layer thickness of uppermost layer (μm) | Average layer thickness of whole coating layer (μm) |
|---|---|---|---|---|---|---|
| Present product | 51 | 10 | 550 | $(Al_{0.30}Ti_{0.70})N$ | 2.0 | 4.0 |
| | 52 | 10 | 550 | $(Al_{0.30}Ti_{0.70})N$ | 2.0 | 4.0 |
| | 53 | 10 | 550 | $(Al_{0.50}Ti_{0.50})N$ | 2.0 | 4.0 |
| | 54 | 10 | 550 | $(Al_{0.50}Ti_{0.50})N$ | 2.0 | 4.0 |
| Comparative product | 55 | 20 | 850 | $(Al_{0.50}Ti_{0.50})N$ | 2.0 | 4.0 |
| | 56 | 20 | 850 | $(Al_{0.50}Ti_{0.50})N$ | 2.0 | 4.0 |
| | 57 | 10 | 550 | $(Al_{0.70}Ti_{0.30})N$ | 2.0 | 4.0 |
| | 58 | 10 | 550 | $(Al_{0.70}Ti_{0.30})N$ | 2.0 | 4.0 |

With regard to the obtained samples, the composition and the average layer thickness of Layer A and Layer B of the lower layer, the laminating period in which the layer thickness of Layer A of the lower layer and the layer thickness of Layer B of the lower layer are summed, the number of uppermost layer at a direction parallel to an interface between the coating layer and the substrate, the average grain diameter Ly of the uppermost layer at a direction perpendicular to an interface between the coating layer and the substrate and the grain diameter ratio (Ly/Lx) of the average grain diameter Ly to the average grain diameter Lx were measured under the same measurement conditions as in Example 1. These results are shown in Table 10.

TABLE 10

| | | Uppermost layer | | |
|---|---|---|---|---|
| Sample No. | | Average grain diameter Lx at direction parallel to interface of substrate (nm) | Average grain diameter Ly at direction perpendicular to interface of substrate (nm) | Grain diameter ratio (Ly/Lx) of Ly to Lx |
| Present product | 51 | 550 | 576 | 1.05 |
| | 52 | 530 | 528 | 1.00 |
| | 53 | 500 | 516 | 1.03 |
| | 54 | 480 | 456 | 0.95 |
| Comparative product | 55 | 100 | 48 | 0.48 |
| | 56 | 90 | 40 | 0.44 |
| | 57 | 55 | 32 | 0.58 |
| | 58 | 50 | 24 | 0.48 |

The obtained sample was attached to the following mentioned milling cutter and Machining test 5 was carried out. Processing distances until the samples reach to the tool life were shown in Table 11.

[Machining test 5]
Work piece material: SCM440,
Cutting speed: 250 m/min,
Feed: 0.1 mm/tooth,
Depth of cut: 2.0 mm,
Width of cut: 50 mm,
Cutter effective diameter: φ100 mm,
Coolant: Not used (dry processing),
Judgement of tool life: When a maximum flank wear width reached to 0.2 mm, then the time was the end of tool life.

TABLE 11

| Sample No. | | Machining test 5 Processing distance until sample reaches to tool life (m) |
|---|---|---|
| Present product | 51 | 9.2 |
| | 52 | 8.4 |
| | 53 | 8.3 |
| | 54 | 7.3 |
| Comparative product | 55 | 2.9 |
| | 56 | 2.4 |
| | 57 | 1.9 |
| | 58 | 1.4 |

As shown in Table 11, Present products having large average grain diameters Lx at a direction parallel to an interface between the coating layer and the substrate are excellent in wear resistance so that the processing distances until the samples reach to the tool life were longer than those of Comparative products.

EXPLANATION OF REFERENCE NUMERALS

1: Crystal grain of coating layer
2: The state where crystal grain of coating layer dropped
3: Coating layer
4: Substrate
5: Interface at surface side
6: Interface at substrate side

The invention claimed is:

1. A coated cutting tool which comprises
a substrate and a coating layer formed on a surface of the substrate,
at least one layer of the coating layer being a coarse grain layer having an average grain diameter Lx measured at a direction parallel to an interface of the coating layer and the substrate exceeding 200 nm, and a composition of which being represented by $(Al_aTi_bM_c)X$, wherein:
a grain diameter ratio (Ly/Lx) of an average grain diameter Ly of the coarse grain layer measured at a direction perpendicular to an interface between the coating layer and the substrate to said average grain diameter Lx of the coarse grain layer measured at a direction parallel to an interface between the coating layer and the substrate is 0.7 or more and less than 1.5,
M represents at least one kind of an element(s) selected from the group consisting of Zr, Hf, V, Nb, Ta, Cr, Mo, W, Y, B and Si,
X represents at least one kind of an element(s) selected from the group consisting of C, N and O,
a represents an atomic ratio of an Al element based on a total of the Al element, a Ti element and an M element,
b represents an atomic ratio of a Ti element based on a total of an Al element, the Ti element and an M element,
c represents an atomic ratio of an M element based on a total of an Al element, a Ti element and the M element,
a, b and c each satisfy $0.30 \leq a \leq 0.65$, $0.35 \leq b \leq 0.70$, $0 \leq c \leq 0.20$ and $a+b+c=1$, and
an average layer thickness of the coarse grain layer being 0.2 to 10 μm.

2. The coated cutting tool according to claim 1, wherein a, b and c each satisfy $0.30 \leq a \leq 0.50$, $0.50 \leq b \leq 0.70$, $0 \leq c \leq 0.20$ and $a+b+c=1$.

3. The coated cutting tool according to claim 1, wherein X of the coarse grain layer represents N.

4. The coated cutting tool according claim 1, wherein an average grain diameter Lx of the coarse grain layer measured at a direction parallel to an interface of the coating layer and the substrate is in the range of 400 nm to 1,000 nm.

5. The coated cutting tool according to claim 1, wherein the coarse grain layer is cubic.

6. The coated cutting tool according to claim 5, wherein a full width at half maximum intensity (FWHM) of an X-ray diffraction peak of a (200) plane of the coarse grain layer is 0.6° or less.

7. The coated cutting tool according to claim 1, wherein the coating layer contains a lower layer formed on a surface of the substrate and a coarse grain layer formed on a surface of the lower layer, and the lower layer is a single layer or a multilayer containing at least one kind of a material(s) selected from
a metal containing at least one kind of metallic elements selected from the group consisting of Ti, Zr, Hf, V, Nb, Ta, Cr, Mo, W, Y, Al and Si, and
a compound containing at least one kind of these metallic elements and at least one kind of nonmetallic elements selected from the group consisting of carbon, nitrogen, oxygen and boron.

8. The coated cutting tool according to claim 1, wherein the coarse grain layer is an uppermost layer.

9. A coated cutting tool which comprises
a substrate and a coating layer formed on a surface of the substrate,
at least one layer of the coating layer being a coarse grain layer having an average grain diameter Lx measured at a direction parallel to an interface between the coating layer and the substrate exceeding 200 nm, and a composition of which being represented by $(Al_dCr_eL_f)Z$, wherein:

a grain diameter ratio (Ly/Lx) of an average grain diameter Ly of the coarse grain layer measured at a direction perpendicular to an interface between the coating layer and the substrate to said average grain diameter Lx of the coarse grain layer measured at a direction parallel to an interface between the coating layer and the substrate is 0.7 or more and less than 1.5, L represents at least one kind of an element(s) selected from the group consisting of Ti, Zr, Hf, V, Nb, Ta, Mo, W, Y, B and Si, Z represents at least one kind of an element(s) selected from the group consisting of C, N and O, d represents an atomic ratio of an Al element based on a total of the Al element, a Cr element and an L element, e represents an atomic ratio of a Cr element based on a total of an Al element, the Cr element and an L element, f represents an atomic ratio of an L element based on a total of an Al element, a Cr element and the L element, d, e and f each satisfy $0.25 \leq d \leq 0.70$, $0.30 \leq e \leq 0.75$, $0 \leq f < 0.20$ and $d+e+f=1$, and an average layer thickness of the coarse grain layer being 0.2 to 10 μm.

10. The coated cutting tool according to claim 9, wherein d, e and f each satisfy $0.40 \leq d \leq 0.70$, $0.30 \leq e \leq 0.50$, $0 \leq f \leq 0.20$, $d \geq e$ and $d+e+f=1$.

11. The coated cutting tool according to claim 9, wherein Z of the coarse grain layer represents N.

12. The coated cutting tool according to claim 9, wherein an average grain diameter Lx of the coarse grain layer measured at a direction parallel to an interface between the coating layer and the substrate is in the range of 400 nm to 1,000 nm.

13. The coated cutting tool according to claim 9, wherein the coarse grain layer is cubic.

14. The coated cutting tool according to claim 13, wherein a full width at half maximum intensity (FWHM) of an X-ray diffraction peak at a (200) plane of the coarse grain layer is 0.6° or less.

15. The coated cutting tool according to claim 9, wherein the coating layer contains a lower layer formed on a surface of the substrate and a coarse grain layer formed on a surface of the lower layer, and the lower layer is a single layer or a multilayer containing at least one kind of a material(s) selected from a metal containing at least one kind of metallic elements selected from the group consisting of Ti, Zr, Hf, V, Nb, Ta, Cr, Mo, W, Y, Al and Si, and a compound containing at least one kind of these metallic elements and at least one kind of nonmetallic elements selected from the group consisting of carbon, nitrogen, oxygen and boron.

16. The coated cutting tool according to claim 9, wherein the coarse grain layer is an uppermost layer.

* * * * *